United States Patent
Harbers et al.

(10) Patent No.: US 7,070,300 B2
(45) Date of Patent: Jul. 4, 2006

(54) REMOTE WAVELENGTH CONVERSION IN AN ILLUMINATION DEVICE

(75) Inventors: Gerard Harbers, Sunnyvale, CA (US); Matthijs H. Keuper, San Jose, CA (US)

(73) Assignee: Philips Lumileds Lighting Company, LLC, San Jose, CA (US)

( * ) Notice: Subject to any disclaimer, the term of this patent is extended or adjusted under 35 U.S.C. 154(b) by 46 days.

(21) Appl. No.: 10/861,769

(22) Filed: Jun. 4, 2004

(65) Prior Publication Data

US 2005/0270775 A1    Dec. 8, 2005

(51) Int. Cl.
*F21V 9/00* (2006.01)
(52) U.S. Cl. .................... 362/231; 362/19; 362/293
(58) Field of Classification Search ............... 362/231, 362/19, 293; 359/326
See application file for complete search history.

(56) References Cited

U.S. PATENT DOCUMENTS

| | | | | |
|---|---|---|---|---|
| 5,504,661 | A | 4/1996 | Szpak | 362/30 |
| 5,813,752 | A | 9/1998 | Singer et al. | 362/293 |
| 5,813,753 | A | 9/1998 | Vriens et al. | 362/293 |
| 5,897,201 | A | 4/1999 | Simon | 362/268 |
| 5,982,092 | A | 11/1999 | Chen | 313/512 |
| 6,504,301 | B1 | 1/2003 | Lowery | 313/512 |
| 6,582,103 | B1 | 6/2003 | Popovich et al. | 362/307 |
| 6,682,207 | B1 | 1/2004 | Weber et al. | |
| 6,696,703 | B1 | 2/2004 | Mueller-Mach et al. | |
| 6,869,206 | B1 | 3/2005 | Zimmerman et al. | |
| 2002/0145685 | A1 | 10/2002 | Mueller-Mach et al. | 349/61 |
| 2004/0027543 | A1* | 2/2004 | Ouchi et al. | 353/31 |

FOREIGN PATENT DOCUMENTS

WO  WO 02/069030  9/2002
WO  WO 02/075440  9/2002

* cited by examiner

*Primary Examiner*—Sandra O'Shea
*Assistant Examiner*—Mark Tsidulko

(57) ABSTRACT

An illumination device uses a wavelength converting element, such as a phosphor layer, that is physically separated from a light source, such as one or more light emitting diodes, a Xenon lamp or a Mercury lamp. The wavelength converting element is optically separated from the light source, so that the converted light emitted by the wavelength converting element is prevented from being incident on the light source. Accordingly, the temperature limitations of the wavelength converting element are removed, thereby permitting the light source to be driven with an increased current to produce a higher radiance. Moreover, by optically separating the wavelength converting element from the light source, the conversion and recycling efficiency of the device is improved, which also increases radiance.

59 Claims, 6 Drawing Sheets

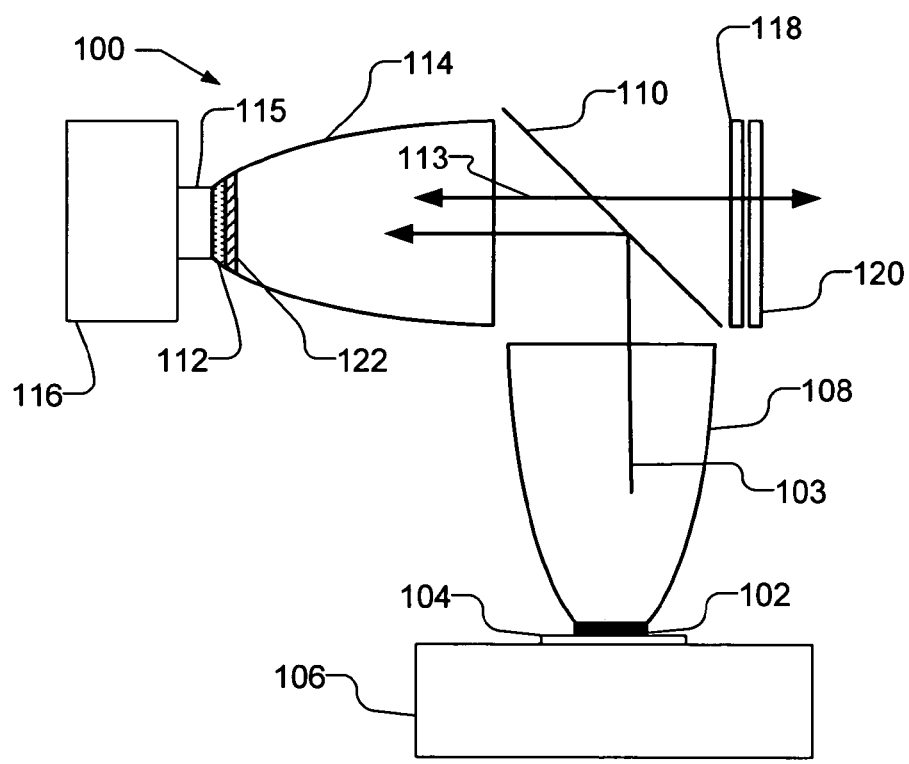
Fig. 1
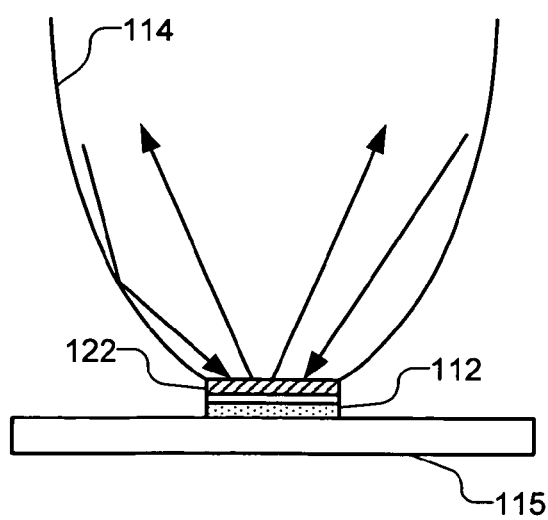 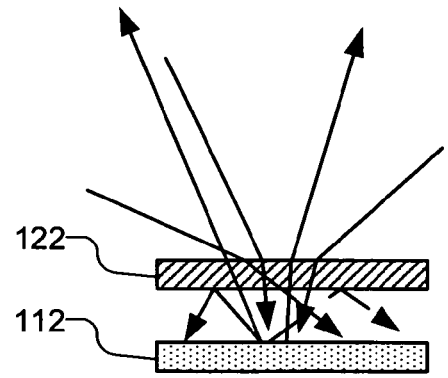
Fig. 2A          Fig. 2B

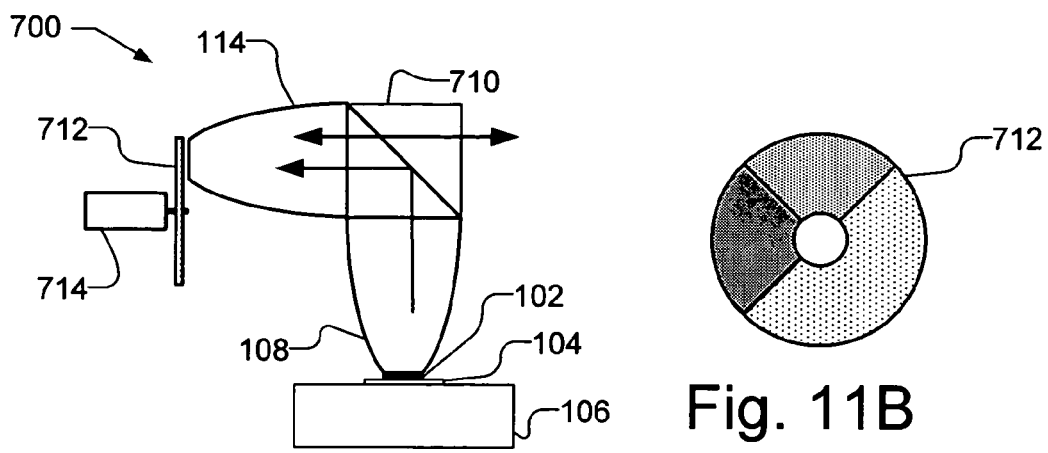
Fig. 11A
Fig. 11B
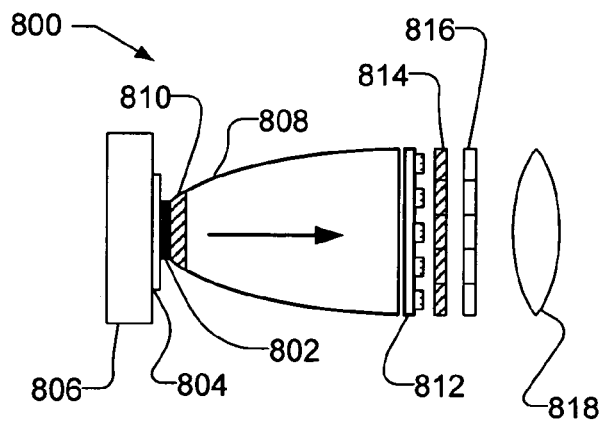
Fig. 12
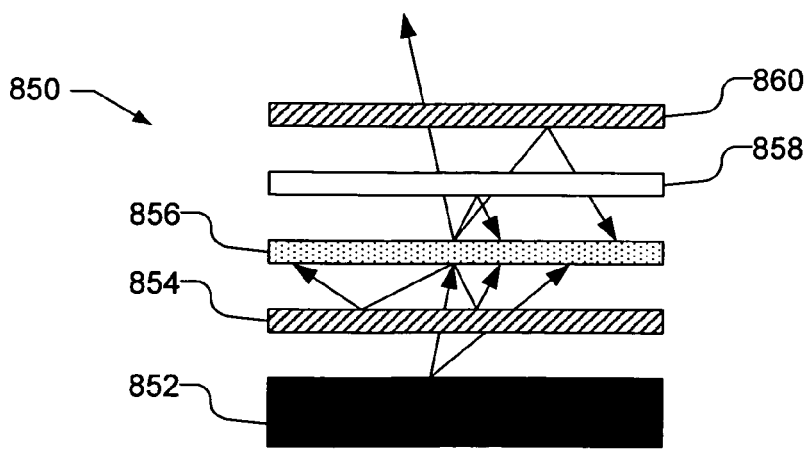
Fig. 13

REMOTE WAVELENGTH CONVERSION IN AN ILLUMINATION DEVICE

FIELD OF THE INVENTION

The present invention is related to an illumination device and, in particular, to wavelength conversion of light produced by high radiance light sources, including semiconductor light emitting devices.

BACKGROUND

With the development of efficient light emitting diodes (LEDs) that emit blue light or ultraviolet or near ultraviolet light, commonly referred to herein as UV light, it has become feasible to produce LEDs that generate light through phosphor conversion of a portion of the primary emission of the LED (or the entire primary emission) to longer wavelengths. Conversion of primary emission of the LED to longer wavelengths is commonly referred to as down-conversion of the primary emission. In some systems, an unconverted portion of the primary emission of the LED combines with the converted light of longer wavelengths to produce the desired colored light, e.g., white light. Alternatively, the entire primary emission is converted to light with longer wavelengths and then combined to produce the desired light.

Conventionally, wavelength conversion of the primary emission of the LED is achieved using a phosphor that is held in a binding medium, such as epoxy, silicone, or other similar material. The phosphor is generally in the form of a powder that is mixed into the binding medium prior to curing. The uncured slurry containing the phosphor powder is deposited onto the LED to encapsulate the LED and subsequently cured.

It is desirable, however, to use high radiance phosphor-converted LEDs in many illumination applications, such as in projectors, automobile headlights, fiber optics and theater lights. One difficulty with phosphor encapsulated LEDs, however, is that the binding medium turns opaque and turns brown when subjected to high temperatures. This temperature limitation of the encapsulant, accordingly, limits the current at which the LED can be driven, which limits the radiance of the phosphor-converted LED.

SUMMARY

In accordance with an embodiment of the present invention, an illumination device uses a wavelength converting element that is physically separated from a light source, such as a light emitting diode or an array of light emitting diodes, a Xenon lamp or a Mercury lamp. The wavelength converting element, which may be, e.g., a phosphor layer, is additionally optically separated from the light source such that converted light emitted by the wavelength converting element is not incident on the light source. By physically separating the wavelength converting element from the light source, the temperature limitations of the wavelength converting element are removed, thereby permitting the light source to be driven with an increased current to produce a higher radiance. Moreover, by preventing the converted light from being incident on the light source, the conversion and recycling efficiency of the device is improved, which also increases radiance.

Thus, in one aspect of the present invention, an illumination device includes a light source that emits light having a first wavelength range along a first beam path and a wavelength converting element in the first beam path. The wavelength converting element is physically separated from the light source. The wavelength converting element converts the light having a first wavelength range into light having a second wavelength range along a second beam path. The device further includes a color separation element that is disposed between the light source and the wavelength converting element. The color separation element is configured to prevent substantially all of the light having the second wavelength range from being incident on the light source.

In another aspect of the present invention, an illumination device includes a light source that emits light having a first wavelength range and a first optical element that is associated with the light source. The first optical element collimates the light emitted from the light source along a first beam path. The illumination device also includes a color separation element in the first beam path, where the color separation element is configured to direct substantially all of the collimated light along the first beam path toward a second optical element. The second optical element focuses the collimated light. A wavelength converting element receives the focused light from the second optical element and is configured to at least partially absorb light of the first wavelength range and to emit light having a second wavelength range. The second optical element collimates the light having the second wavelength range emitted by the wavelength converting element. The color separation element prevents light having a second wavelength range from being incident on the light source.

In another aspect, a device includes a light source that emits light having a first wavelength range and a first color separation element that receives the emitted light. The first color separation element is configured to direct substantially all of the light emitted by the light source toward a wavelength converting element. The wavelength converting element is configured to at least partially absorb the light of the first wavelength range and to emit light having a second wavelength range. The first color separation element prevents light having a second wavelength range from being incident on the light source. Additionally, the device includes a second color separation element that receives light emitted by the wavelength converting element. The second color separation element is configured to reflect light in the first wavelength range back to the wavelength converting element, to transmit light in the second wavelength range that is incident on the second color separation element in a first range of angles and to reflect light that is incident on the second color separation element outside the first range of angles.

BRIEF DESCRIPTION OF THE DRAWINGS

FIG. 1 illustrates an illumination device in accordance with one embodiment of the present invention.

FIGS. 2A and 2B illustrate the operation of the wavelength converting element with a radiance enhancement structure.

FIGS. 11A and 11B illustrate another embodiment of an illumination device that includes a rotating wavelength converting element.

FIG. 12 illustrates another embodiment of an illumination device that includes a wavelength converting element with phosphor dots, which may be used as backlighting for a liquid crystal display (LCD) panel.

FIG. 13 illustrates an embodiment of a device that includes a semiconductor light emitting device, a first color separation element, a wavelength converting element, an optional polarization recovery element, and a second color separation element.

DETAILED DESCRIPTION

Figure 3A:
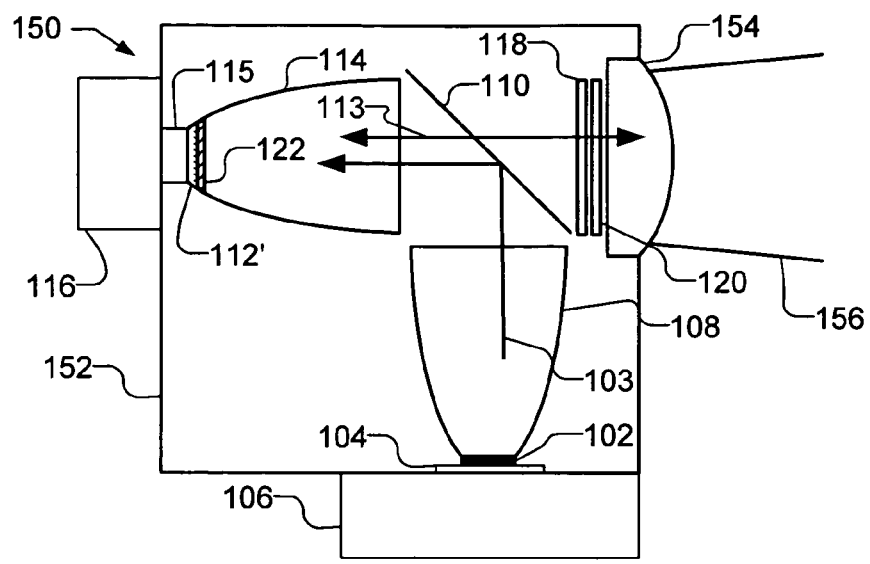
FIGS. 3A and 3B illustrate an illumination device used as a headlight.

In accordance with an embodiment of the present invention, the wavelength converting element is physically separated from the light source, which increases the permissible temperatures and, thus, current at which a semiconductor light emitting device can be driven (if used as the light source). Accordingly, the temperature limitations of the wavelength converting medium will no longer place a limitation on the radiance of the light source. The light source may be, e.g., a semiconductor light emitting device, or other sources of short wavelength radiation, such as a Xenon lamp or mercury lamp. Additionally, the beam path of the wavelength converted light is separated from the light source, i.e., the converted light is prevented from being incident on the light source. Accordingly, absorption losses that may occur in the light source are advantageously reduced thereby providing large efficiency gain in conversion and recycling, which increases radiance.

FIG. 1 illustrates an illumination device 100 in accordance with one embodiment of the present invention. FIG. 1 includes a light source 102 that for the sake of simplicity is sometimes referred to herein as a light emitting device (LED) 102. The light source may be a semiconductor light emitting device, such as a light emitting diode or array of light emitting diodes, or other types of light sources that can produce short wavelength light, such as a Xenon lamp or Mercury lamp. By way of example, the LED 102 may be a high radiance device, such as the type described in U.S. Ser. No. 10/652,348, entitled "Package for a Semiconductor Light Emitting Device", by Frank Wall et al., filed Aug. 29, 2003, having the same assignee as the present disclosure and which is incorporated herein by reference. The LED 102 is shown on an optional submount 104, which is mounted on a heatsink 106.

As shown in FIG. 1, illumination device 100 includes a wavelength converting element 112 that is physically separated from the LED 102. The LED 102 and the wavelength converting element 112 may be separated along the beam path by, e.g., air, gas or a vacuum. The length of the physical separation of the LED 102 and the wavelength converting element 112 may vary, but in one embodiment is greater than 1 mm. The physical separation between the LED 102 and the wavelength converting element 112 is sufficient to prevent substantial conductive heating (ideally the separation is sufficient to prevent any conductive heating) of the wavelength converting element 112 by the LED 102.

Wavelength converting element 112 may be, e.g., a conventionally produced layer of phosphor or other wavelength converting material in a binding medium, such as epoxy or silicone. The type and amount of phosphor used in wavelength converting element 112 is dependent on the factors such as the primary emission wavelength range of the LED 102 and the desired wavelengths of the converted light. It should be understood that LED 102 generally produces a primary emission that has a range of wavelengths. The range of wavelengths is generally narrow and, thus, LEDs are sometimes characterized by a single wavelength, which is the dominant or peak wavelength in the spectrum produced. In one embodiment, where the LED 102 produces wavelengths in the blue, UV or near UV spectrum, wavelength converting element 112 may use phosphors such as: Thiogallate (TG), SrSiON:Eu, or SrBaSiO:Eu to produce converted light in the green spectrum; BaSrSiN:Eu to produce converted light in the amber spectrum; CaS:Eu, (Sr0.5, Ca0.5)S:Eu, SrS:Eu, and SrSiN:Eu to produce converted light in the red spectrum; and YAG to produce white converted light. For ease of reference, the wavelength converting element is sometimes referred to herein as a phosphor element, but it should be understood that other wavelength converting materials, such as dyes, may be used.

The phosphor element 112 is shown mounted on a highly reflective substrate 115, such as an ESR specular reflecting film manufactured by 3M or E60L white diffuse reflecting film manufactured by Toray, and thermally coupled to a heatsink 116. It should be understood that, if desired, the LED 102 and phosphor element 112 may share the same heatsink if the heatsink is large enough to prevent significant conductive heating of the phosphor element 112. Because the phosphor element 112 is physically separated from the LED 102, the heat produced by LED 102 will have little or no affect on the operation of the phosphor element 112. Accordingly, the LED 102 can be driven with a high current to produce a high radiance. Moreover, with the use of a heatsink 116, heat from the phosphor element 112 caused by phosphor light conversion can be dissipated. Because heating of phosphor can degrade performance by approximately 20 to 30 percent, the use of a heatsink 116 can dramatically increase performance of the phosphor element 112.

In addition, at least a portion of the beam path 103 of the light emitted from LED 102 is separate from the beam path 113 of the converted light from phosphor element 112. Device 100 uses a color separation element 110 that reflects wavelengths in the primary light emitted by LED 102 and transmits wavelengths in the converted light emitted by phosphor element 112. In one embodiment, the color separation element 110 may be, e.g., a dichroic mirror, and for ease of reference, the color separation element will sometimes be referred to herein as a dichroic mirror. Nevertheless, it should be understood that other color separation elements may be used with the present invention, such as a dichroic cube, a diffractive optical element or a hologram. An adequate dichroic mirror may be purchased from, e.g., Unaxis Balzers Ltd. located in Liechtenstein or Optical Coating Laboratory, Inc. located in Santa Rosa, Calif.

The color separation element 110 is used to prevent a substantial amount of the converted light emitted by phosphor element 112 from being incident on the LED 102. Ideally no converted light would be incident on the LED 102, however, color separation elements, such as dichroic mirrors are not ideal and may leak between 0 and 30 percent of the converted light. Accordingly, absorption of the converted light by LED 102 is reduced, thereby improving efficiency in conversion and recycling, and thus in the radiance of the illumination device 100.

Optical elements are used to collimate the primary light and converted light prior to being incident on the dichroic mirror 110. For example, a collimator 108 between the LED 102 and the dichroic mirror 110 is used to collimate the light emitted by LED 102. Another collimator 114 between the phosphor element 112 and the dichroic mirror 110 is used to collimate the converted light emitted by the phosphor element 112, and to focus the primary light reflected by the dichroic mirror 110 onto the phosphor element 112. It should be understood that the optical elements need not be collimators, but may be other optical elements, such as a reflective compound parabolic concentrator element, a total internal reflecting optical element, a rectangular reflective angle transformer, a condenser lens, a lens assembly, or a combination of such elements. Because color separation elements, such as dichroic mirrors, are angle dependent, the optical elements preferably produce a narrow light cone. The optical elements may have, e.g., a circular or rectangular geometry and may be conventionally formed of materials such as molded plastic or metal, such as aluminum, or metal alloys. If the LED 102 is driven at a high temperature, the use of a temperature insensitive material, such as metal or glass is particularly advantageous.

In operation, the phosphor element 112 receives the primary light from the LED 102 and converts the primary light to another wavelength range by absorbing the primary light and emitting the converted light. Light from the LED 102 that is not absorbed by the phosphor element 112 is reflected by the reflective substrate 115 and reflected back to the LED 102 by the dichroic mirror 110, where the light is reflected back to the phosphor element 112. Thus, the non-absorbed primary light is at least partially recycled in illumination device 100. Additionally, because the phosphor element 112 emits light in all directions, the reflective substrate 115 is used to reflect a portion of the converted light towards the dichroic mirror 110. The converted light is then transmitted by the dichroic mirror 110.

As illustrated in FIG. 1, additional optical elements may be located after the dichroic mirror 110. By way of example, the device 100 may include a radiance enhancement film 118. A radiance enhancement film may be, e.g., a diffractive optical element, such as that manufactured by Heptagon located in Zurich, Switzerland, or a micro refractive element or Brightness Enhancement Film, such as that manufactured by 3M. Additionally, device 100 may include a polarization recovery component 120, sometimes referred to as a non-absorbing polarizer, such as that manufactured by Moxtek, Inc. located in Orem Utah, or by 3M known as a Dual Brightness Enhancement Film. In some embodiments, the relative positions of the radiance enhancement film 118 and polarization recovery component 120 maybe reversed.

The radiance enhancement film 118 and polarization recovery component 120 restrict the angular distribution and polarization state of the light produced by illumination device 100, by transmitting the desired light and reflecting the undesired light back towards the phosphor element 112. Because the phosphor element 112 has very little absorption of the light generated, the recycling efficiency is very high.

It should be understood that while FIG. 1 illustrates the LED 102 and phosphor element 112 oriented at 90 degrees with respect to each other, other angles may be used. For example, because the color separation and efficiency of dichroic mirrors is angle dependent, it may be desirable for the LED 102 and phosphor element 112 to be oriented at less than 45 degrees with respect to each other.

In one embodiment, a radiance enhancement structure 122 (and/or polarization recovery component) may be mounted over the phosphor element 112. FIGS. 2A and 2B illustrate closer views of the operation of the phosphor element 112 with a radiance enhancement structure 122. The radiance enhancement structure 122 may be separated from the phosphor element 112 or may be in physical contact with the phosphor element 112. The radiance enhancement structure 122 is, e.g., a dichroic mirror or diffractive optical element. If a dichroic mirror is used, the dichroic mirror is designed such that the primary light emitted by the LED 102 is transmitted over a large range of incident angles, but that converted light emitted by the phosphor element 112 is transmitted over a limited range of incident angles, e.g., 30 degrees or less from the surface normal, as illustrated in FIGS. 2A and 2B. By transmitting converted light at a narrow angle, the radiance enhancement structure 122 ensures that a large percentage of the light will be utilized downstream.

FIG. 2B illustrates that converted light emitted by the phosphor element 112 at large angles will be reflected by the radiance enhancement structure 122 to be reabsorbed and reemitted by the phosphor element 112. Thus, part of the light will be emitted during a second pass, thereby increasing the radiance of the illumination device 100.

Figure 3B:
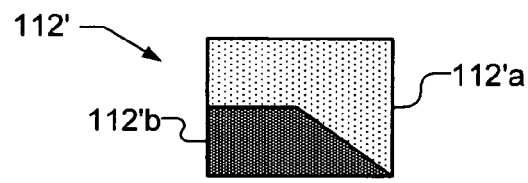

FIGS. 3A and 3B illustrate an illumination device 150 that is similar to device 100, like designated elements being the same. As illustrated, device 150 is adapted for use as an automobile headlight and includes an enclosure 152 for the components and a projection lens 154 that produces the resulting beam 156. A similar configuration may be used as a spot light if desired.

As illustrated in FIG. 3B, the phosphor element 112' may be patterned with different types or amounts of phosphor to form, e.g., a standardized headlight beam pattern. By way of example, as shown in FIG. 3B, a first portion 112'*a* of the phosphor element 112' may include a blend of yellow and blue phosphor, in which case the LED 102 emits a lower wavelength range, e.g., UV light. Alternatively, the first portion 112'*a* may use a yellow phosphor while the LED 102 emits blue light and the dichroic mirror 110 is partially transparent to blue light. The second portion 112'*b* of the phosphor element 112' may have less or no phosphor or a different blend of phosphor. The portion 112'*b* with little or no phosphor will convert less light than the portion 112'*a*. The dichroic mirror 110 will transmit the light converted by portion 112'*a* and will reflect most of the unconverted blue light from portion 112'*b* back towards the LED 102. Thus, the standardized beam pattern formed by portions 112'*a* and 112'*b* will be projected by the projection lens 154.

It should be understood that other patterns may be produced by illumination device 150 in a similar manner. For example, with proper patterning of the phosphor element 112', messages and/or symbols may be projected by the device 150.

Figure 4:
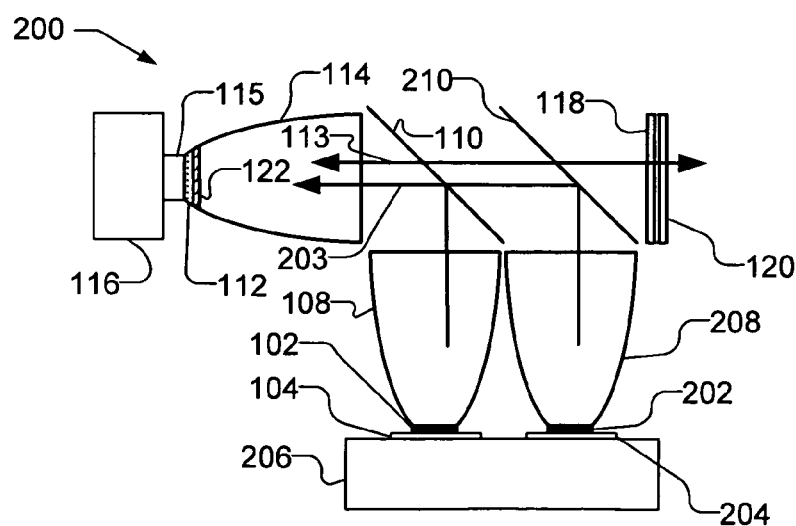
FIG. 4 illustrates another embodiment of an illumination device that is similar to the device shown in FIG. 1, but that includes an additional light source to approximately double the radiance of the device.

FIG. 4 illustrates another embodiment of an illumination device 200, which is similar to device 100, like designated elements being the same. Illumination device 200 approximately doubles the radiance with respect to device 100 by using two LEDs 102 and 202. The second LED 202 is held on an optional submount 204 and may share a heatsink 206 with LED 102. The second LED 202 emits light that is collimated by collimator 208 and that is reflected towards the phosphor element 112 by a second color separation element, i.e., dichroic mirror 210. In this embodiment, the light emitted by the second LED 202 has a different wavelength range than the light emitted by LED 102. By way of example, the LEDs 102 and 202 may emit light with peak wavelengths that differ by approximately 20 nm, e.g., approximately 430 nm and 450 nm or 400 nm and 435 nm. The phosphor element 112 should have a large absorption spectrum or a mixture of phosphors so that the primary light from LEDs 102 and 202 is converted. With the use of the two LEDs 102 and 202, the device 200 has approximately twice the radiance of device 100.

Figure 5:
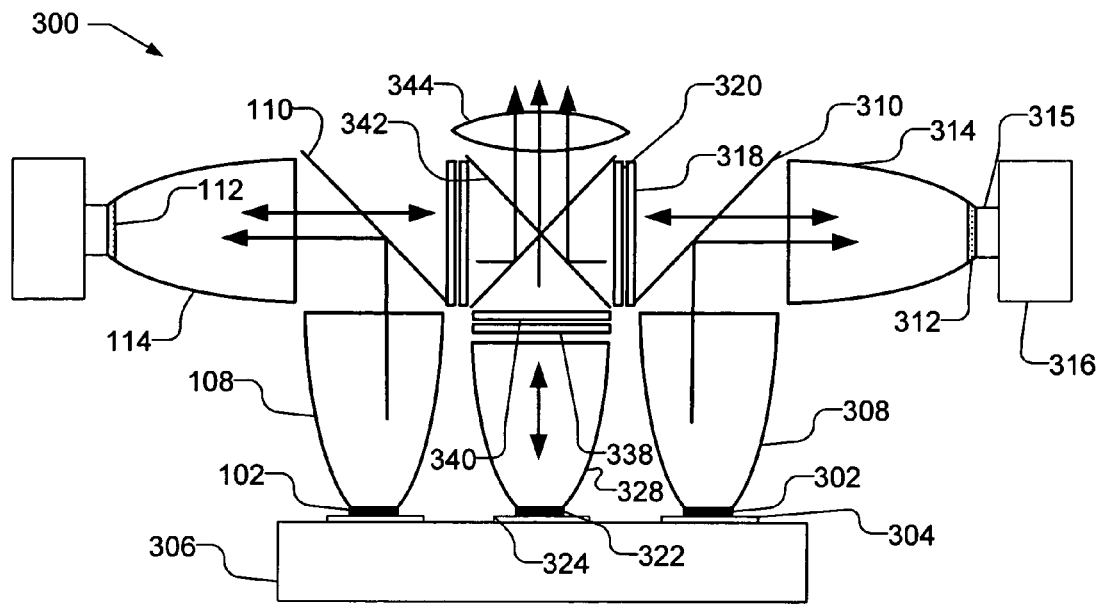
FIG. 5 illustrates another embodiment of an illumination device with a plurality of light sources and wavelength converting elements to produce, e.g., combined red, green, and blue light.

FIG. 5 illustrates another embodiment of an illumination device 300 that includes a plurality of light sources and a plurality of remote wavelength converting elements. Device 300 may be used to produce combined red, green and blue light, which may be used in e.g., a color sequential projector, such as a Digital Light Processing (DLP) projector or a Liquid Crystal on Silicon (LCOS) projector. If desired, additional colors may be produced by device 300, such as cyan and amber.

Device 300 is similar in operation to device 100, like designated elements being the same. Device 300, however, includes additional LEDs 302 and 322 that are held on respective optional submounts 304 and 324. All the LEDs 102, 302, and 322 may share the same heatsink 306.

Device 300 generates red and green light using remote phosphor elements 112 and 312, respectively, in the same manner as described above in reference to FIG. 1. Thus, optical elements, such as collimator 308, collimate the primary light, which may be blue or UV light, from LED 302 and dichroic mirror 310 reflects the light towards a second phosphor element 312. Collimator 314 focus the light on the phosphor element 312, which is held on a reflective mirror 315 and heatsink 316. Converted green light from phosphor element 312 is transmitted through dichroic mirror 310 and transmitted through (or reflected for recycling by) a radiance enhancement film 318 and polarization recovery component 320.

Device 300 may directly produce blue light, e.g., using an LED 322 with a primary emission in the blue spectrum. As illustrated in FIG. 5, optical elements, such as collimator 328, collimate the blue emitted light, which is transmitted through (or reflected for recycling by) a radiance enhancement film 338 and polarization recovery component 340. The use of radiance enhancement films and polarization recovery components increase the radiance and polarization and makes the illumination of the device 300 more uniform.

If desired, radiance enhancement films, such as that described in reference to FIGS. 2A and 2B may be located before the phosphor elements 112 and 312.

Alternatively, device 300 may produce blue light in the same manner as described above in reference to FIG. 1, i.e., using an LED with a primary emission in the UV spectrum and using a physically separated phosphor element that converts the primary emission into blue light. In an embodiment in which converted blue light is used, the necessary components, i.e., color separation element, optical elements and phosphor element may extend into or out of the plane of FIG. 5.

The device 300 includes an X-plate 342, e.g., two dichroic mirrors in a crossed geometry, and a condenser lens 344 to combine the red, green and blue light. If desired, a single radiance enhancement film and polarization recovery component pair may be located between the X-plate 342 and the condenser lens 344 thereby obviating the need for three pairs of radiance enhancement films and polarization recovery components.

If desired, device 300 may produce additional colors, e.g., amber and cyan, using additional LEDs and phosphor elements in the same manner as described in reference to FIG. 1. The additional LEDs, phosphor elements, and associated optical elements and dichroic mirrors may extend into or out of the plane of the page.

Figure 6:
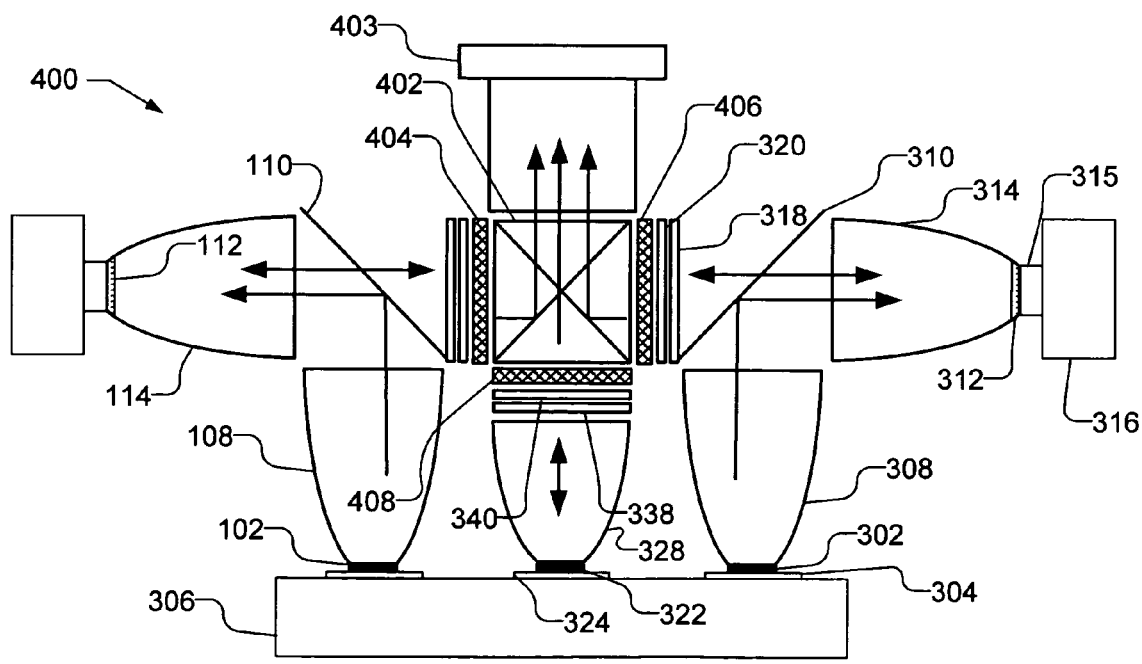
FIG. 6 illustrates another embodiment of an illumination device that is similar to the shown in FIG. 5.

FIG. 6 illustrates an illumination device 400 that is similar to device 300, like designated elements being the same. Device 400, however, is configured for a three panel LCD projection device, such as the type made by Epson (Japan). Device 400 includes an X-cube 402 in front of a projection lens 403. The X-cube 402 combines the red, green and blue images generated by microdisplays 404, 406, and 408, respectively, which are, e.g., High Temperature Poly Silicon (HTPS) LCD displays.

Figure 7:
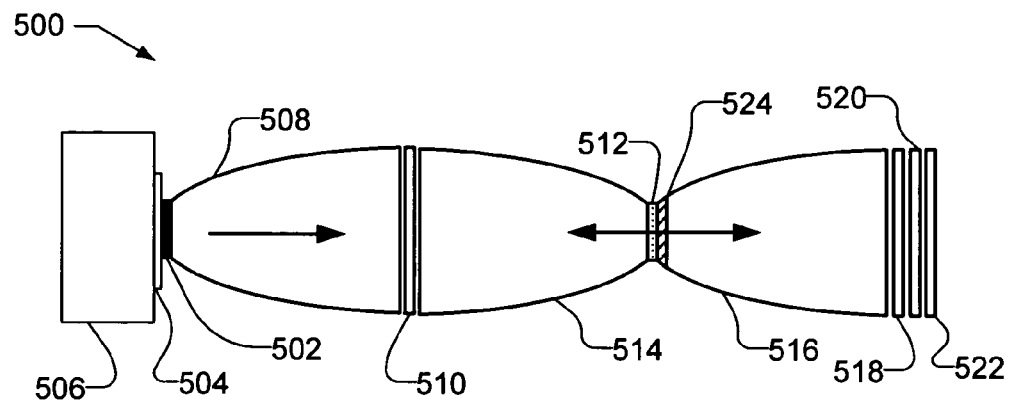
FIG. 7 illustrates another embodiment of an illumination device that has a linear arrangement of the light source and wavelength converting element.

FIG. 7 illustrates another embodiment of an illumination device 500. Device 500 has a linear arrangement of the light source and remote, i.e., physically separate, wavelength converting element, which is particularly advantageous for illumination devices with space limitations, such as a flash light. As shown in FIG. 7, device 500 includes an LED 502 on an optional submount 504 and heat sink 506. A collimator 508, or other optical element, collimates the primary light emitted from LED 502, which is transmitted through dichroic mirror 510 towards phosphor element 512. A second collimator 514 focuses the primary light that is transmitted through the dichroic mirror 510 to the phosphor element 512.

The phosphor element 512 absorbs the primary light emitted by LED 502 and emits light having longer wavelengths in both directions, i.e., towards and away from the dichroic mirror 510. The dichroic mirror 510 reflects converted light emitted by the phosphor element 512 back towards phosphor element 512. Thus, dichroic mirror 510 prevents converted light from being incident on the LED 502 thereby improving efficiency of the device 500.

A portion of the converted light emitted from phosphor element 512 is collimated by collimator 516, or other appropriate optical element. A second dichroic mirror 518 transmits the converted light and reflects any unconverted light back towards the phosphor element 512. A radiance enhancement film 520 and polarization recovery component 522 may be located after the dichroic mirror 518 to recycle light that cannot be used downstream of the device 500. If desired, an additional radiance enhancement film 524 or polarization recovery component may be located on the phosphor element 512, e.g., as described in reference to FIGS. 2A and 2B.

Figure 8:
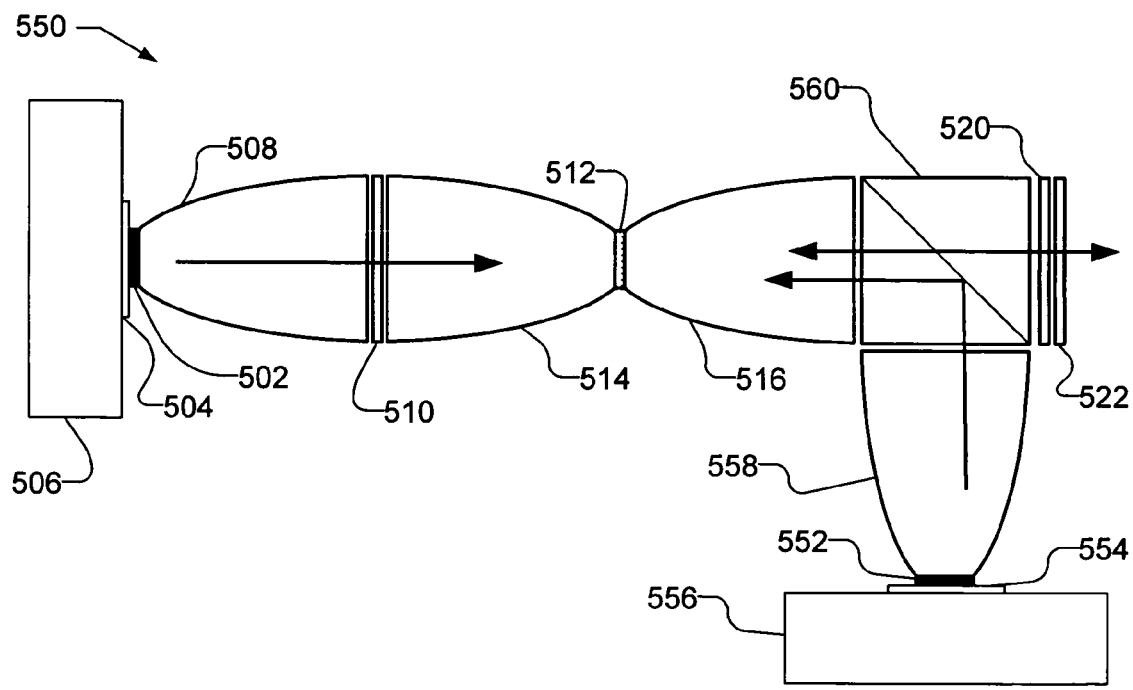
FIG. 8 illustrates another embodiment of an illumination device that is similar to the device shown in FIG. 7, but that includes an additional light source to approximately double the radiance of the device.

FIG. 8 is another embodiment of an illumination device 550, which is similar to device 500, like designated elements being the same. Device 550, however, uses an additional light source so that the phosphor element 512 is illuminated from the front and back, thereby approximately doubling the radiance of the device. As shown in FIG. 8, device 550 uses a second LED 552 (on an optional submount 554 and heatsink 556) and a collimator 558 as a second light source. A dichroic cube 560, or other appropriate device, such as a dichroic mirror, reflects light emitted by LED 552 towards the phosphor element 512 and transmits converted light from the phosphor element 512. The two LEDs 502 and 552 may emit primary light having the same wavelength ranges.

Figures 9A, 9B:
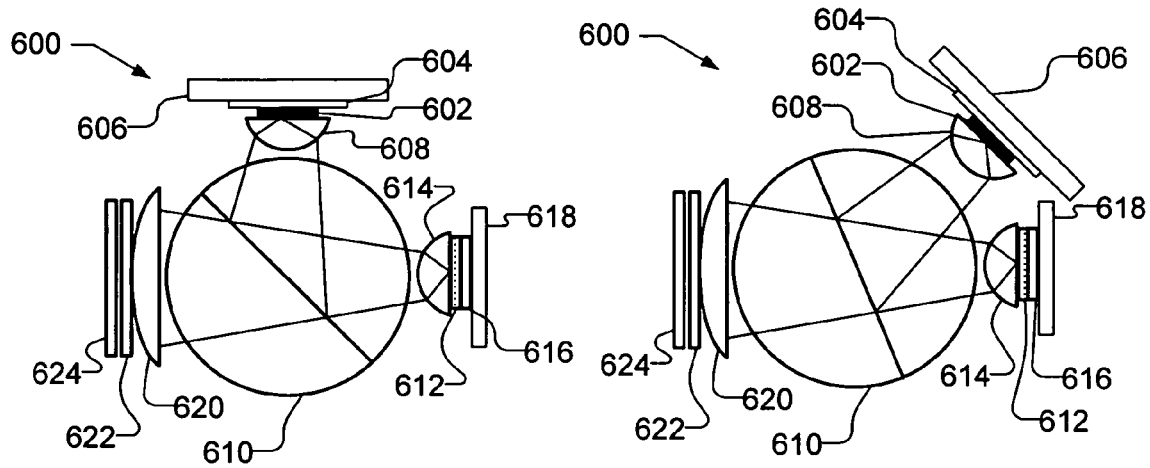
FIGS. 9A and 9B illustrate another embodiment of an illumination device in which the function of the optical elements and the dichroics are combined in a dichroic sphere.

FIG. 9A is another embodiment of an illumination device 600. Illumination device 600 advantageously combines the function of the optical elements and the dichroics using a dichroic sphere 610. As illustrated in FIG. 9A, device 600 includes an LED 602 held on an optional submount 604 and heatsink 606. A condenser lens 608, which is held close to or in contact with the LED 602, may be used in conjunction with a dichroic sphere 610 to image the LED 602 onto the phosphor element 612. The dichroic sphere 610 may be, e.g., a glass or plastic sphere with a dichroic film deposited in the center, similar to a dichroic cube.

A condenser lens 614 may be held close to or in contact with the phosphor element 612, which is mounted on a reflective submount 616 and heatsink 618. The phosphor element 612 converts the light emitted from the LED 602 to light with longer wavelengths, which is transmitted through the dichroic sphere 610 to lens 620. The converted light is collimated or otherwise focused by lens 620. If desired, a radiance enhancement film 622 and polarization recovery component 624 may be disposed after or before the lens 620.

FIG. 9B is another illustration of illumination device 600 with the dichroic sphere 610 operating at a more efficient angle. As discussed above, dichroics operate with better color separation and efficiency at smaller angles of incidence. Thus, FIG. 9B illustrates the LED 602 and phosphor element 612 are at an angle of approximately 45 degrees with respect to each other and, thus, the dichroic sphere 610 is at an angle of approximately 22.5 degrees with respect to each of the LED 602 and phosphor element 612. Of course, other angles may be used, e.g., less than approximately 22.5 degrees.

Figure 10:
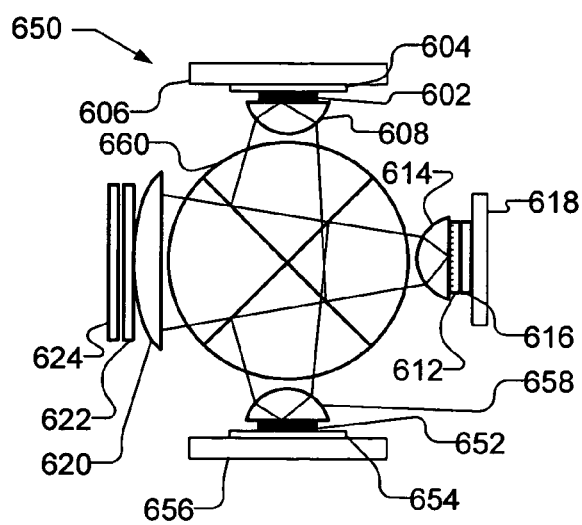
FIG. 10 illustrates another embodiment of an illumination device that is similar to the device shown in FIG. 9A, but that includes an additional light source to approximately double the radiance of the device.

FIG. 10 is another embodiment of an illumination device 650 that is similar to device 600 like designated elements being the same. Device 650, however, includes a second LED 652 on an optional submount 654 and heatsink 656, which is optically coupled to the dichroic sphere 660 through, e.g., a condenser lens 658. The LEDs 602 and 652 may emit light with different wavelengths. The dichroic sphere 660 includes two dichroic mirrors that are responsive to wavelengths emitted by LEDs 602 and 652. The phosphor element 612 may include a combination of phosphors for the different wavelengths of light.

If desired, as described in FIG. 9B, the phosphor element 612 may be at other angles, e.g., approximately 45 degrees or less, with respect to both LED 602 and LED 652 and, thus, the color separation element in dichroic sphere 610 may be at other angles, e.g., approximately 22.5 degrees or less, with respect to each of the LEDs 602 and 652 and the phosphor element 612.

FIG. 11A illustrates another embodiment of an illumination device 700 that may be used, e.g., as a color sequential projector or a studio or theater light. Device 700 is similar to device 100 shown in FIG. 1, like designated elements being the same. Device 700, however, uses a dichroic cube 710 instead of a dichroic mirror 110. Moreover, the wavelength converting element in device 700 is phosphor covered disk 712, which has a highly reflective substrate. The disk 712 may have multiple colored sections, each having different types and/or amounts of phosphor. FIG. 11B illustrates a plan view of the disk 712, which three different sections of the disk 712 with different types of phosphors.

The disk 712 is rotated by motor 714. As the disk 712 spins, the different sections of the disk 712, and thus, different phosphors, are illuminated thereby producing different colors. Spinning the disk 712, additionally, may be used to cool the phosphor and can be used to generate air flow for cooling the heatsink 106.

The color emitted by the device 700 may be controlled by synchronizing the duty cycle of the LED 102 and the spinning of the disk. Alternatively, the disk 712 may be held rotated and stopped to illuminate a different portion of the disk 712 when a different color is desired. In another application, the disk 712 may include multi color phosphors or may contain sections with different messages or symbols, such as logos. The device 700 would thus project the message or symbol, which can then be changed by rotating the disk 712 to illuminate another phosphor message or symbol on the disk 712.

FIG. 12 illustrates another embodiment of an illumination device 800 that may be used e.g., as backlighting for a liquid crystal display (LCD) panel. In this embodiment, an LED is used to produce a blue backlight that is used in combination with a phosphor dot pattern consisting of red and green phosphor dots, which are aligned with LCD pixels representing the red and green image pixels, respectively, while the blue pixels are left blank or applied with a non-phosphor scattering material. If desired, the LED may produce UV light or near UV light wherein blue phosphor dots are used in conjunction with the red and green phosphor dots.

As illustrated in FIG. 12, an LED 802, on an optional submount 804 and heatsink 806, is used with a collimator 808 or other appropriate optical element. The LED 802 produces, e.g., blue or UV light. A wavelength converting element 812, which includes, e.g., red and green phosphor dots (and blue phosphor dots if the LED 802 produces UV light), is located at end of the collimator 808 opposite the LED 802. A dichroic mirror 810 is disposed between the LED 802 and the wavelength converting element 812, e.g., on the LED 802. The dichroic mirror 810 transmits the blue or UV light emitted by the LED 802 but reflects long wavelengths. Thus, substantially all light emitted by the wavelength converting element 812 towards the LED 802 will be reflected by the dichroic mirror 810 and will not be incident on the LED 802.

A second dichroic mirror 814, or radiance enhancing film, is disposed between the wavelength converting element 812 and an LCD panel 816 and lens 818. The second dichroic mirror 814 may be configured with a plurality of dichroic elements, each dichroic element being aligned with a corresponding phosphor dot, e.g., red, green and blue dichroic elements are aligned with red, green and blue emitting phosphor dots, respectively. As discussed in reference to FIGS. 2A and 2B, the second dichroic mirror 814 is configured to transmit light over a narrow range of angles and reflects light outside the range of angles back towards the wavelength converting element 812 and dichroic mirror 810. For example, light emitted by the phosphor dots at an angle of less than approximately 30 degrees from normal will be transmitted through the second dichroic mirror 814, while light outside that range is reflected. Accordingly, the pixels in the LCD panel 816 advantageously receive light at a narrow range of angles, thereby improving performance of the device.

FIG. 13 illustrates an embodiment of a device 850 that includes a semiconductor light emitting device 852, a first dichroic element 854, a wavelength converting element 856, a polarizing element 858, and a second dichroic element 860. Some or all of the various elements shown in FIG. 13 may be separated, e.g., by an air gap. For example, in one embodiment, the various elements 852, 854, 856, 858, and 860 are separated from each other by 1 mm or more. Alternatively, some or all of the elements shown in FIG. 13 may be in physical contact, i.e., with one element on top and physically contacting the next.

In this embodiment, the semiconductor light emitting device 852 emits light in the blue or UV wavelengths. The wavelength converting element 856 converts the light from the semiconductor light emitting device 852 to other wavelengths, e.g., red, green or blue. As illustrated by the arrows in FIG. 13, the first dichroic element 854 transmits light that is emitted by the semiconductor light emitting device 852 and reflects light emitted by the wavelength converting element 856. The polarizing element 858, which may be omitted if desired, serves a as a polarization recovery component and transmits one polarization state and reflects the other polarization states back to the wavelength converting element 856. The second dichroic element 860 serves as a radiance enhancement film by transmitting light emitted by the wavelength converting element 856 over a narrow range of angles, e.g., within 25 degrees from normal, and reflecting light that is outside the range of angles back towards the wavelength converting element 856. The second dichroic element 860 also reflects unconverted light from the semiconductor light emitting device 852 that leaked through the wavelength converting element 856 back to the wavelength converting element 856. Thus, the second dichroic element 860 separates light based on both color and angle of incidence. The light that exits the dichroic element 860 is, thus, converted light that is polarized and is within a narrow range of angles.

Although the present invention is illustrated in connection with specific embodiments for instructional purposes, the present invention is not limited thereto. Various adaptations and modifications may be made without departing from the scope of the invention. For example, various combinations of elements discussed throughout this disclosure maybe used in accordance with the present invention. Therefore, the spirit and scope of the appended claims should not be limited to the foregoing description.

What is claimed is:

1. An illumination device comprising:
   a light source that emits light having a first wavelength range along a first beam path;
   a wavelength converting element in the first beam path, the wavelength converting element being physically separated from the light source, the wavelength converting element converting the light having a first wavelength range into light having a second wavelength range along a second beam path; and
   a color separation element disposed between the light source and the wavelength converting element, the color separation element being configured to prevent substantially all of the light having the second wavelength range from being incident on the light source.

2. The illumination device of claim 1, wherein the light source is one of a semiconductor light emitting device, a Xenon lamp, and a Mercury lamp.

3. The illumination device of claim 1, wherein the light source comprises one or more light emitting diodes.

4. The illumination device of claim 1, further comprising at least one of a radiance enhancement film and a polarization recovery component coupled to receive the light emitted from the wavelength converting element.

5. The illumination device of claim 4, wherein the radiance enhancement film comprises at least one of a diffractive optical element and a micro refractive element and wherein the polarization recovery component comprises a non-absorbing polarizer.

6. The illumination device of claim 1, wherein the wavelength converting element is a phosphor.

7. The illumination device of claim 6, wherein the phosphor is patterned.

8. The illumination device of claim 6, wherein the wavelength converting element comprises a rotatable element, the rotatable element having at least a first section being covered with a first phosphor that converts the light having a first wavelength range to the light having the second wavelength range and a second section being covered with a second phosphor that converts the light having a first wavelength range to the light having a third wavelength range, wherein the color separation element is configured to further prevent substantially all of the light having the third wavelength range from being incident on the light source.

9. The illumination device of claim 1, wherein the color separation element is selected from the group consisting of a dichroic mirror, a dichroic cube, a dichroic sphere, a diffractive optical element and a hologram.

10. The illumination device of claim 1, wherein the wavelength converting element is mounted on a reflective submount.

11. The illumination device of claim 1, further comprising a lens, wherein the color separation element reflects the light having a first wavelength range from the light source to the wavelength converting element and transmits the light having the second wavelength range from the wavelength converting element to the lens.

12. The illumination device of claim 1, further comprising:
   a first optical element disposed between the light source and the color separation element, the first optical element collimates the light emitted from the light source; and
   a second optical element disposed between the wavelength converting element and the color separation element, the second optical element focuses the collimated light from the light source on the wavelength converting element and collimates the converted light having a second wavelength range.

13. The illumination device of claim 12, wherein the first optical element and the second optical element each include at least one of a collimator, reflective compound parabolic concentrator element, total internal reflecting optical element, a rectangular reflective angle transformer, a condenser lens, and a lens assembly.

14. The illumination device of claim 12, further comprising:
   a second light source that emits light having a third wavelength range along a third beam path;
   wherein the color separation element is a first color separation element that is further disposed between the second light source and the wavelength converting element, the first color separation element configured to transmit substantially all of the light having the second wavelength range and the light having the third wavelength range and to reflect substantially all of the light having a first wavelength range; and
   a second color separation element disposed between the second light source and the first color separation element, the second color separation element being configured to transmit substantially all of the light having the second wavelength range and to reflect substantially all of the light having the third wavelength range;

wherein the wavelength converting element is in the first beam path and the third beam path, the wavelength converting element converting both the light having the first wavelength range and the light having the third wavelength range into light having the second wavelength range.

15. The illumination device of claim 14, further comprising:
a third optical element disposed between the second light source and the second color separation element, the third optical element collimates the light emitted from the second light source.

16. The illumination device of claim 12, further comprising:
a second light source that emits light having a third wavelength range along a third beam path;
a second wavelength converting element in the third beam path, the second wavelength converting element being physically separated from the second light source, the second wavelength converting element converting the light having the third wavelength range to light having a fourth wavelength range along a fourth beam path; and
a second color separation element disposed between the second light source and the second wavelength converting element, the second color separation element being configured to prevent substantially all of the light having the fourth wavelength range from the second wavelength converting element from being incident on the second light source; and
a third color separation element disposed between the wavelength converting element and the second wavelength converting element, the third color separation element being configured to combine the light having the second wavelength range and the light having the fourth wavelength range.

17. The illumination device of claim 16, further comprising a lens disposed after the third color separation element.

18. The illumination device of claim 16, wherein the third color separation element is one of an X-plate and an X-cube.

19. The illumination device of claim 16, wherein the lens is a condenser lens.

20. The illumination device of claim 16, further comprising a third light source that emits a light having a fifth wavelength range, wherein the third color separation element is further configured to combine the light having the second wavelength range, the light having the fourth wavelength range, and the light having the fifth wavelength range.

21. The illumination device of claim 20, further comprising:
a first of at least one of a radiance enhancement film and a polarization recovery component disposed between the color separation element and the third color separation element;
a second of at least one of a radiance enhancement film and a polarization recovery component disposed between the second color separation element and the third color separation element; and
a third of at least one of a radiance enhancement film and a polarization recovery component disposed between the third light source and the third color separation element.

22. The illumination device of claim 21, further comprising:

a first microdisplay disposed between the first of at least one of a radiance enhancement film and a polarization recovery component and the third color separation element;
a second microdisplay disposed between the second of at least one of a radiance enhancement film and a polarization recovery component and the third color separation element; and
a third microdisplay disposed between the third of at least one of a radiance enhancement film and a polarization recovery component and the third color separation element;
wherein the lens is a projector lens.

23. The illumination device of claim 16, further comprising:
a third light source that emits light having a fifth wavelength range along a fifth beam path;
a third wavelength converting element in the fifth beam path, the third wavelength converting element being physically separated from the third light source, the third wavelength converting element converting the light having the fifth wavelength range to light having a sixth wavelength range along a sixth beam path; and
a fourth color separation element disposed between the third light source and the third wavelength converting element, the fourth color separation element being configured to prevent substantially all of the light having the sixth wavelength range from the third wavelength converting element from being incident on the third light source;
wherein the third color separation element is further configured to combine the light having the second wavelength range, the light having the fourth wavelength range, and the light having the sixth wavelength range.

24. The illumination device of claim 23, wherein the second wavelength range, fourth wavelength range and sixth wavelength range are in the red, green and blue spectra, respectively.

25. The illumination device of claim 1, wherein the color separation element transmits the light having a first wavelength range from the light source to the wavelength converting element and reflects the light having the second wavelength range from the wavelength converting element back to the wavelength converting element.

26. The illumination device of claim 25, the device further comprising:
a first optical element disposed between the light source and the color separation element, the first optical element collimates the light emitted from the light source;
a second optical element disposed between the wavelength converting element and the color separation element, the second optical element focuses the collimated light from the light source on the wavelength converting element, wherein the color separation element is disposed between the first optical element and the second optical element; and
a third optical element, wherein the wavelength converting element is disposed between the second optical element and the third optical element, the wavelength converting element emits light having the second wavelength range along the second beam path and along a third beam path that is in the opposite direction of the second beam path, the third optical element collimates the light having the second wavelength range along the third beam path and the second optical element collimates the light having the second wavelength range along the second beam path.

27. The illumination device of claim 26, wherein the first optical element, the second optical element, and the third optical element each include at least one of a collimator, reflective compound parabolic concentrator element, total internal reflecting optical element, a rectangular reflective angle transformer, a condenser lens, and a lens assembly.

28. The illumination device of claim 26, further comprising a second color separation element, the wavelength converting element being disposed between the second color separation element and second optical element, the second color separation element transmits light having the second wavelength range and reflects light having the first wavelength range back to the wavelength converting element.

29. The illumination device of claim 26, further comprising
   a second light source that emits light having a third wavelength range along a third beam path;
   a second color separation element disposed between the second light source and the wavelength converting element, the second color separation element being configured to transmit substantially all of the light having the second wavelength range and to reflect substantially all of the light having the third wavelength range;
   a fourth optical element disposed between the second light source and the second color separation element, the fourth optical element collimates the light emitted from the second light source;
   wherein the wavelength converting element is in the first beam path and the third beam path, the third optical element focuses the collimated light from the second light source onto the wavelength converting element, the wavelength converting element converts both the light having the first wavelength range and the light having the third wavelength range into light having the second wavelength range.

30. The illumination device of claim 26, wherein the first wavelength range and the third wavelength range are approximately the same wavelength range.

31. The illumination device of claim 1, further comprising a second color separation element disposed over the wavelength converting element, the second color separation element configured to transmit light having the first wavelength range over a first range of angles and to transmit light having the second wavelength range over a second range of angles, the second range of angles is smaller than the first range of angles, wherein the second color separation element reflects light having the second wavelength range outside the second range of angles back to the wavelength converting element.

32. The illumination device of claim 31, wherein the second range of angles is approximately 30 degrees.

33. The illumination device of claim 31, wherein the second color separation element is a dichroic mirror.

34. The illumination device of claim 31, wherein the second color separation element is disposed in the beam path between the light source and the wavelength converting element.

35. The illumination device of claim 31, wherein the wavelength converting element is disposed in the beam path between the light source and the second color separation element, the illumination device further comprising a third color separation element that transmits light having the second wavelength range and reflecting light having the first wavelength range, the second color separation element being disposed between the third color separation element and the wavelength converting element.

36. The illumination device of claim 1, further comprising a second color separation element disposed over the wavelength converting element, the second color separation element configured to transmit light having the second wavelength range over a range of angles, wherein the second color separation element reflects light having the second wavelength range outside the range of angles back to the wavelength converting element.

37. The illumination device of claim 36, wherein the wavelength converting element comprises a plurality of phosphor dots, the illumination device further comprising an LCD panel wherein the second color separation element is disposed between the wavelength converting element and the LCD panel.

38. The illumination device of claim 37, further comprising:
   an optical element disposed between the light source and the wavelength converting element, the optical element collimates the light emitted from the light source; and
   a lens, the LCD panel being disposed between the second color separation element and the lens.

39. The illumination device of claim 1, wherein the wavelength converting element is physically separated from the light source by more than one millimeter.

40. The illumination device of claim 1, wherein the wavelength converting element is physically separated from the light source by one of air, gas, and vacuum.

41. The illumination device of claim 1, wherein the wavelength converting element is physically separated from the light source sufficiently to prevent substantial conductive heating of the wavelength converting element by the light source.

42. A device comprising:
   a light source that emits light having a first wavelength range;
   a first optical element associated with the light source, the first optical element collimates the light emitted from the light source along a first beam path;
   a color separation element in the first beam path, the color separation element configured to direct substantially all of the collimated light along the first beam path toward a second optical element, the second optical element focuses the collimated light; and
   a wavelength converting element receiving the focused light from the second optical element, the wavelength converting element configured to at least partially absorb light of the first wavelength range and to emit light having a second wavelength range, the second optical element collimates the light having the second wavelength range emitted by the wavelength converting element, wherein the color separation element prevents light having a second wavelength range from being incident on the light source.

43. The illumination device of claim 42, wherein the light source is one of a semiconductor light emitting device, a Xenon lamp, and a Mercury lamp.

44. The illumination device of claim 42, wherein the light source comprises one or more light emitting diodes.

45. The device of claim 42, wherein the color separation element reflects light having a first wavelength range and transmits light having a second wavelength range.

46. The device of claim 45, wherein the wavelength converting element is mounted on a reflective substrate.

47. The device of claim 46, wherein the reflective substrate is mounted on a heatsink.

48. The device of claim 42, wherein the color separation element transmits light having a first wavelength range and reflects light having a second wavelength range.

49. The device of claim 48, further comprising a third optical element, the wavelength converting element being disposed between the second optical element and the third optical element, the third optical element collimates light having a second wavelength range emitted by the wavelength converting element.

50. The device of claim 49, further comprising a second color separation element, the third optical element being disposed between the second color separation element and the wavelength converting element, the second color separation element transmits light having the second wavelength range and reflects light having the first wavelength range.

51. A device comprising:
a light source that emits light having a first wavelength range;
a first color separation element that receives light emitted by the light source, the first color separation element is configured to direct substantially all of the light emitted by the light source toward a wavelength covering element;
the wavelength converting element receives the light from the first color separation element, the wavelength converting element is configured to at least partially absorb light of the first wavelength range and to emit light having a second wavelength range, wherein the first color separation element prevents light having a second wavelength range from being incident on the light source; and
a second color separation element that receives light emitted by the wavelength converting element, the second color separation element is configured reflect light in the first wavelength range back to the wavelength converting element and to transmit light in the second wavelength range that is incident on the second color separation element in a first range of angles and to reflect light in the second wavelength range that is incident on the second color separation element outside the first range of angles.

52. The illumination device of claim 51, wherein the light source is one of a semiconductor light emitting device, a Xenon lamp, and a Mercury lamp.

53. The illumination device of claim 51, wherein the light source comprises one or more light emitting diodes.

54. The device of claim 51, further comprising a polarization recovery component, wherein the wavelength converting element is disposed between the polarization recover component and the light source.

55. The device of claim 51, wherein the light emitted by the light source having a first wavelength range is reflected by the first color separation element and light emitted by the wavelength converting element having a second wavelength range is transmitted through the first color separation element before being incident on the second color separation element.

56. The device of claim 51, further comprising:
a first optical element disposed between the light source and the first color separation element, the first optical element collimates the light emitted from the light source; and
a second optical element disposed between the first color separation element and the wavelength converting element, the second optical element focuses the light from the first color separation element towards the wavelength converting element.

57. The device of claim 56, further comprising a third optical element disposed between the wavelength converting element and the second color separation element, the third optical element collimates the light emitted by the wavelength converting element.

58. The device of claim 57, wherein the light emitted by the light source having a first wavelength range is transmitted through the first color separation element and light emitted by the wavelength converting element having a second wavelength range is reflected by the first color separation element.

59. The device of claim 51, wherein the wavelength converting element is physically separated from the light source by one of air, gas, and vacuum.

* * * * *